(12) United States Patent
Takeuchi

(10) Patent No.: US 6,819,414 B1
(45) Date of Patent: Nov. 16, 2004

(54) ABERRATION MEASURING APPARATUS, ABERRATION MEASURING METHOD, PROJECTION EXPOSURE APPARATUS HAVING THE SAME MEASURING APPARATUS, DEVICE MANUFACTURING METHOD USING THE SAME MEASURING METHOD, AND EXPOSURE METHOD

(75) Inventor: Hitoshi Takeuchi, Fujisawa (JP)

(73) Assignee: Nikon Corporation, Tokyo (JP)

( * ) Notice: Subject to any disclaimer, the term of this patent is extended or adjusted under 35 U.S.C. 154(b) by 551 days.

(21) Appl. No.: 09/714,183

(22) Filed: Nov. 17, 2000

(51) Int. Cl.$^7$ .................................................. G01B 9/00
(52) U.S. Cl. ...................................... 356/124; 356/126
(58) Field of Search ............................... 356/124, 126; 250/201.2, 548

(56) References Cited

U.S. PATENT DOCUMENTS

| | | | |
|---|---|---|---|
| 3,973,953 A | 8/1976 | Montgomery | 96/1 |
| 4,405,232 A | 9/1983 | Mansell | 356/121 |
| 4,413,909 A | 11/1983 | Pohle | 356/354 |
| 4,438,330 A | 3/1984 | Hardy | 250/201 |
| 4,490,039 A | 12/1984 | Bruckler et al. | 356/121 |
| 4,620,790 A | 11/1986 | Hufnagel | 356/124 |
| 4,667,103 A | 5/1987 | Watson et al. | 250/332 |
| 4,725,138 A | 2/1988 | Wirth et al. | 356/121 |
| 4,737,621 A | 4/1988 | Gonsiorowski et al. | 250/201 |
| 5,202,748 A | 4/1993 | MacDonald et al. | 356/360 |
| 5,233,174 A | 8/1993 | Zmek | 250/201.9 |
| 5,294,971 A | 3/1994 | Braunecker et al. | 356/121 |
| 5,300,766 A | 4/1994 | Granger et al. | 250/201.9 |
| 5,424,552 A * | 6/1995 | Tsuji et al. | 250/548 |
| 5,493,391 A | 2/1996 | Neal et al. | 356/121 |
| 5,629,765 A | 5/1997 | Schmutz | 356/121 |
| 5,680,200 A | 10/1997 | Sugaya et al. | 355/53 |
| 5,754,299 A | 5/1998 | Sugaya et al. | 356/401 |
| 5,789,734 A * | 8/1998 | Torigoe et al. | 250/201.2 |
| 5,825,476 A | 10/1998 | Abitol et al. | 356/124 |
| 5,864,381 A | 1/1999 | Neal et al. | 351/205 |
| 5,912,731 A | 6/1999 | DeLong et al. | 356/121 |
| 5,936,720 A | 8/1999 | Neal et al. | 356/121 |
| 6,052,180 A | 4/2000 | Neal et al. | 356/121 |
| 6,130,419 A | 10/2000 | Neal | 250/201.9 |
| 6,184,974 B1 | 2/2001 | Neal et al. | 356/121 |

FOREIGN PATENT DOCUMENTS

| | | |
|---|---|---|
| EP | 0 833 193 A | 1/1998 |
| JP | 59-226317 | 12/1984 |
| JP | 2-238338 | 9/1990 |
| JP | 9-49781 | 2/1997 |
| JP | 10-92722 | 4/1998 |

OTHER PUBLICATIONS

Gourlay et al., "A real–time closed–loop liquid crystal adaptive optics system: first results", *Optics Communications*, vol. 137, No. 1–3, Apr. 15, 1997, pp. 17–21.

(List continued on next page.)

*Primary Examiner*—Frank G. Font
*Assistant Examiner*—Roy M. Punnoose
(74) *Attorney, Agent, or Firm*—Miles & Stockbridge P.C.

(57) ABSTRACT

An aberration measuring apparatus has a converging lens L disposed on the light path of light beam to converge light beam traveling through a measurement target optical system PL on a predetermined surface IP, an aperture stop AP disposed on the light path of light beam to transmit a part of the light beams, a converging position detection unit DET disposed on the predetermined surface to detect a positional deviation of a converging position P of a part of the light beams traveling through the aperture stop on the predetermined surface IP, a moving unit M connected the aperture stop to move the aperture stop within the light beam, and an arithmetic processing unit connected the converging position detection unit to calculate an aberration of the measurement target optical system PL on the basis of an output signal from the converging position detection unit DET.

15 Claims, 9 Drawing Sheets

OTHER PUBLICATIONS

Haig et al., "Effects of Wavefront Aberration on Visual Instrument Performance, and a Consequential Test Technique," *Applied Optics*, Feb. 1, 1987, vol. 26, No. 3, pp. 492–500.

Kitano et al., "Spherical Aberration of Gradient–Index Rod Lenses," *Applied Optics*, 2/83, vol. 22, No. 3, pp. 396–399.

Parity, vol. 05, No. 10, 1990–10, pp. 37–39 (with partial translation).

\* cited by examiner

ABERRATION MEASURING APPARATUS, ABERRATION MEASURING METHOD, PROJECTION EXPOSURE APPARATUS HAVING THE SAME MEASURING APPARATUS, DEVICE MANUFACTURING METHOD USING THE SAME MEASURING METHOD, AND EXPOSURE METHOD

This application claims the benefit of International application No. PCT/JP99/02608 and Japanese Patent application No. 10-153915 which are hereby incorporated by reference.

BACK GROUND OF THE INVENTION

1. Field of the Invention

The present invention relates to a wavefront aberration measuring apparatus for measuring a wavefront aberration and an optical performance of a measurement target optical system, especially projection optical system provided in a projection exposure apparatus, etc. used when manufacturing a measurement target optical system, especially a semiconductor device or a liquid crystal display device, and to an aberration measuring method. The present invention relates also to a projection exposure apparatus having the same measuring apparatus, and a device manufacturing method using the same measuring method. It is to be noted that the present application is based on Japanese Patent Application No.10-153915 of which the contents are hereby incorporated by reference.

2. Related Background Art

There has hitherto been a method of using an interference optical system in the case of measuring a wavefront aberration of a measurement target optical system. According to the method based on the interference optical system, the wavefront aberration is measured by incorporating the measurement target optical system defined as a measurement target into the interference optical system, and the Twyman-Green interferometer and the Fizeau interferometer are known. For example, the Twyman-Green interferometer is constructed such that the light beam from a laser light source is divided into two fluxes of light (beam) by a half-mirror, one flux of light transmit the measurement target optical system, and the other flux of light is set as reference light beam. Then, the light beam transmitting the measurement target optical system interferes with the reference light beam, and an aberration of the measurement target optical system is measured from interference fringes thereof.

Further, what is known as a method of measuring a wavefront of the light beam from the measurement target optical system is a method called the Shack-Hartmann method using a lens array (Parity vol. 05, No. 10, 1990-10, pp. 37–39). A wavefront measurement based on this Shack-Hartmann method is that a fluctuation of the wavefront from the celestial body is measured. As shown in FIG. 9, to begin with, a wavefront (which will hereinafter be termed a [measurement target wavefront]) transmitting a measurement target optical system TL (indicating herein a telescope) is converted into parallel light beam by a collimator lens CL. Then, the parallel light beam is incident on a lens array (which will hereinafter be called a [two-dimensional lens array] where minute lenses L' are two-dimensionally arrayed. Herein, if the measurement target wavefront has a deviation from an ideal wavefront, this deviation appears to be a positional deviation of a converging position of the measurement target wavefront from a converging position of the ideal wavefront on a converging position detection unit DET. The wavefront is thereby measured based on the positional deviation of the converging position of each individual lens of the two-dimensional lens array.

There arise, however, the following problems inherent in the prior art described above. The interferometer method needs an interference optical system device used only for measuring the wavefront aberration. This interference optical system device is easy to be influenced by vibrations because of measuring the interference on the order of wavelength, and therefore requires an anti-vibration board. Therefore, this leads to a scale-up of the device, resulting in a problem of causing a decline of a using efficiency.

A main purpose of the wavefront measurement based on the Shack-Hartmann method is, as mentioned above, originally to measure the fluctuation of the wavefront from the celestial body, and therefore the Shack-Hartmann method is incapable of measuring the wavefront aberration of the lens used in the projection exposure apparatus for manufacturing a semiconductor device, etc.

In the wavefront measurement based on the Shack-Hartmann method, the two-dimensional lens array is used with a high precision, however, if there exists a scatter in terms of an accuracy of each lens of the lens array, an accuracy of detecting the converging position also declines. Hence, there might be a possibility in which the wavefront cannot be measured with the high precision.

SUMMARY OF THE INVENTION

It is a primary object of the present invention, which was devised to obviate the above problems, to provide an aberration measuring apparatus that is small in size, easy to manufacture and capable of readily measuring a wavefront aberration with a high accuracy, an aberration measuring method, a projection exposure apparatus including the same measuring apparatus, a device manufacturing method using the same measuring method, and an exposure method.

To accomplish the above object, according to the invention of aspect 1, an aberration measuring apparatus comprises a converging lens (L) for converging light beam traveling through a measurement target optical system (PL) on a predetermined surface (IP), an aperture stop (AP) for transmitting a part of the light beam, a moving unit (M) for moving the aperture stop within the flux of light (light beam), a converging position detection unit (DET) for detecting a positional deviation of a converging position (P) of a part of the light beam traveling through the aperture stop on the predetermined surface, and an arithmetic processing unit (PC) for calculating an aberration of the measurement target optical system on the basis of an output signal from the converging position detection unit.

According to the invention of aspect 2, the converging lens converges a part of the light beams, and the moving unit moves the converging lens integrally with the aperture stop in the direction intersecting the optical axis of the light beam.

According to the invention of aspect 3, an aberration measuring apparatus for measuring an aberration of a projection optical system (PL) for transferring onto, a substrate (WH), an image of a predetermined circuit pattern formed on a mask (R), comprises an aberration measuring optical system (PH) for emitting a light for measuring the aberration fall upon the projection optical system, a plurality of lens elements (L'), two-dimensionally arrayed, for converging the light beam for measuring the aberration which travel through the projection optical system, a converging position detection unit (DET) for detecting each of positions of the light beam converged by the plurality of lens elements, and a measuring device (PC) for measuring the aberration of the projection optical system on the basis of the converged light beam positions detected by the converging position detection unit. Herein, the aberration measuring optical system may embrace pinholes of a reticle or a stage, or a transmission member for transmitting the light beam in diffusion, which will be mentioned later on.

According to the invention of aspect 4, the aberration measuring optical system may include a mask (R) for measuring the aberration, disposed substantially in the same position as the mask formed with the predetermined circuit pattern is disposed and having a pinhole pattern, and an illumination optical system (1 to 10) for illuminating the mask for measuring the aberration with the light beam.

According to the invention of aspect 5, the illumination optical system may be an illumination optical system (1 to 10) for illuminating the predetermined circuit pattern with the light beam.

According to the invention of aspect 6, an aberration measuring method comprises a step for converging light beams traveling through a measurement target optical system (PL) on a predetermined surface by the use of a converging lens (L), a step for making an aperture stop transmit a part of the light beam;

a moving step for moving the aperture stop (AP) with the flux of light a converging position detecting step for detecting a positional deviation of each of a converging position (P) of a part of the light beam traveling through the aperture stop on the predetermined surface by the use of a converging position detection unit (DET), and an arithmetic processing step for calculating an aberration of the measurement target optical system on the basis of an output signal obtained in the converging position detecting step.

According to the invention of aspect 7, a part of the light beam is converged in the converging step, and the converging lens is moved integrally with the aperture stop in the direction intersecting the optical axis of the light beam in the moving step.

According to the invention of aspect 8, an aberration measuring method of measuring an aberration of a projection optical system (PL) for forming, on a substrate (WH), an image of a predetermined circuit pattern formed on a mask (R), comprises a step for converging the light beams for measuring the aberration that have passed through the projection optical system by the use of a plurality of lens elements (L'), two-dimensionally arrayed a step for detecting each of positions of the light beams converged by the plurality of lens elements, and a step for measuring the aberration of the projection optical system on the basis of the detected light beam positions.

According to the invention of aspect 9, the light beam for measuring the aberration is light beam from a pinhole pattern (PH) on a mask, for measuring the aberration, disposed substantially in the same position as the mask is disposed.

According to the invention of aspect 10, a projection exposure apparatus comprises an illumination optical system (1 to 10) for illuminating a predetermined circuit pattern with the light beam, a projection optical system (PL) for forming the circuit pattern illuminated with the light beam on a substrate (WH), and an aberration measuring apparatus, of aspect 1, for measuring an aberration of the projection optical system.

According to the invention of aspect 11, a projection exposure apparatus comprises an illumination optical system (1 to 10) for illuminating a mask (R) having a predetermined circuit pattern with the light beam, a stage (11) for supporting the mask, a projection optical system (PL) for forming on the substrate an image of the circuit pattern illuminated with the light beam, and an aberration measuring apparatus, of aspect 1, for measuring an aberration of the projection optical system. The stage or the mask has a generation member (PH) for generating light beam for measuring the aberration of the projection optical system.

According to the invention of aspect 12, the generation member is a pinhole pattern (PH) for converting the light beam from the illumination optical system into spherical waves.

According to the invention of aspect 13, the generation member may be a transmission member for transmitting in diffusion the light beam from the illumination optical system.

According to the invention of aspect 14, a projection exposure apparatus having a projection optical system (PL) for transferring onto a substrate (WH) an image of a circuit pattern formed in a mask (R), comprises an aberration measuring optical system (PH) for emitting a light beam for measuring the aberration upon the projection optical system, a lens array (L') for converging the light beams for measuring the aberration which travel through the projection optical system, and a converging position detection unit (DET) for detecting each of positions of the light beams converged by the lens array.

According to the invention of aspect 15, the aberration measuring optical system may include a mask (R) for measuring the aberration, disposed substantially in the same position as the mask formed with the predetermined circuit pattern is disposed and having a pinhole pattern (PH), and an illumination optical system (1 to 10) for illuminating the mask for measuring the aberration with the light.

According to the invention of aspect 16, the projection exposure apparatus may further comprise a control unit (LC) for controlling a position of at least one of optical members constituting the projection optical system on the basis of a detected result given from the converging position detection unit.

According to the invention of aspect 17, the projection exposure apparatus may further comprise a substrate stage (13) for holding the substrate. At least the lens array or the converging position detection unit may be detachably provided on the substrate stage.

According to the invention of aspect 18, a device manufacturing method including a step for transferring an image of a predetermined circuit pattern onto a substrate (WH) by the use of a projection optical system (PL), comprises a step for measuring an aberration of the projection optical system by the use of the aberration measuring method of aspect 6.

According to the invention of aspect 19, a device manufacturing method including a step for transferring an image of a predetermined circuit pattern onto a substrate by the use of a projection optical system (PL), comprises a step for measuring an aberration of the projection optical system by the use of the aberration measuring method of aspect 8.

According to the invention of aspect 20, an exposure method comprises a step for exposing a substrate to the light beam of a predetermined circuit pattern in a way of projecting the circuit pattern on the substrate by the use of the projection exposure apparatus of aspect 11.

According to the invention of aspect 21, an exposure method for transferring onto a substrate (WH) an image of a predetermined circuit pattern by the use of a projection optical system (PL), comprises a step for making light beam for measuring an aberration incident upon the projection optical system before transferring the circuit pattern onto the substrate, a step for converging the light beam for measuring the aberration that have passed through the projection optical system by the use of a plurality of lens elements (L') two-dimensionally arrayed, a step for detecting each of positions of the light beams converged by the plurality of lens elements, a step of measuring the aberration of the projection optical system on the basis of the detected positions of the light beams, and a step for correcting the aberration of the projection optical system on the basis of the measured aberration.

According to the invention of aspect 22, the aberration may be a wavefront aberration of the projection optical system.

According to the invention of aspect 23, an exposure apparatus having a projection optical system (PL) for transferring onto a substrate (WH) an image of a pattern formed on a mask (R), said apparatus comprises: and a holding mechanism for detachably holding the aberration measuring apparatus of aspect.

According to the invention of aspect 24, the holding mechanism may include a first holding member (11) for holding an aberration measuring optical system, and a second holding member (12, 13) for holding a measuring unit (UT') having a plurality of lens elements, a converging position detection unit and a measuring device.

According to the invention of aspect 25, the first holding member may be a mask stage (11) for holding the mask, and the second holding member is a substrate stage (13) for holding the substrate.

According to the invention of aspect 26, the aberration measuring optical system may be a mask (R) for measurement, formed with a pinhole pattern (PH) for measuring the aberration.

According to the invention of aspect 27, an aberration measuring apparatus for measuring an aberration of a projection optical system (PL) for transferring onto a substrate (WH) an image of a pattern formed on a mask (R), comprises a measuring unit (UT') detachably provided on an exposure apparatus including a mask stage (11) for holding the mask, the projection optical system, and a substrate stage (13) for holding the substrate. The measuring unit may Include a plurality of lens elements (L'), two-dimensionally arrayed, for converging light beam for measuring an aberration that have passed through the projection optical system, a converging position detection unit (DET) for detecting each of positions of the light beams converged by the plurality of lens elements, and a measuring device (PC) for measuring the aberration of the projection optical system on the basis of the light beam positions detected by the converging position detection unit.

According to the invention of aspect 28, the aberration measuring apparatus may further comprise an aberration measuring optical system (PH) through which the light beam for measuring the aberration fall on the projection optical system. The measuring unit may be detachably held on the substrate stage, and the aberration measuring optical system is provided on the mask stage.

According to the invention of aspect 29, an aberration measuring method for measuring an aberration of a projection optical system (PL) incorporated into an exposure apparatus for transferring onto a substrate (WH) an image of a pattern formed on a mask (R), comprises a step for disposing an aberration measuring optical system (PH), for emitting a light beam for measuring the aberration fall upon the projection optical system, substantially in the same position as the mask is disposed, and a step for attaching, to a substrate stage (13) for holding the substrate, a measuring unit (UT') including a plurality of lens elements (L') for converging light beams for measuring an aberration that have passed through the projection optical system, a converging position detection unit (DET) for detecting each of positions of the light beams converged by the lens array, and a measuring device (PC) for measuring the aberration of the projection optical system on the basis of the light beam positions detected by the converging position detection unit.

According to the invention of aspect 30, an aberration measuring method may further comprise a step for removing the aberration measuring optical system after the light beam for measuring the aberration have fallen upon the projection optical system, and a step for removing the measuring unit from the substrate stage after measuring the aberration of the projection optical system.

According to the invention of aspect 31, an exposure method for transferring onto a substrate (WH) an image of a predetermined circuit pattern by the use of a projection optical system (PL), comprises a step of measuring an aberration of the projection optical system by the use of the aberration measuring method of aspect 29 before transferring the circuit pattern onto the substrate.

According to the invention of aspect 32, a device manufacturing method including a step of transferring onto a substrate (WH) an image of a predetermined circuit pattern by the use of a projection optical system (PL), comprises a step of measuring an aberration of the projection optical system by the use of the aberration measuring method of aspect 29 before transferring the circuit pattern onto the substrate.

DESCRIPTION OF THE PREFERRED EMBODIMENTS

Embodiments of the present invention will hereinafter be described with reference to the accompanying drawings.

First Embodiment

Figure 1:
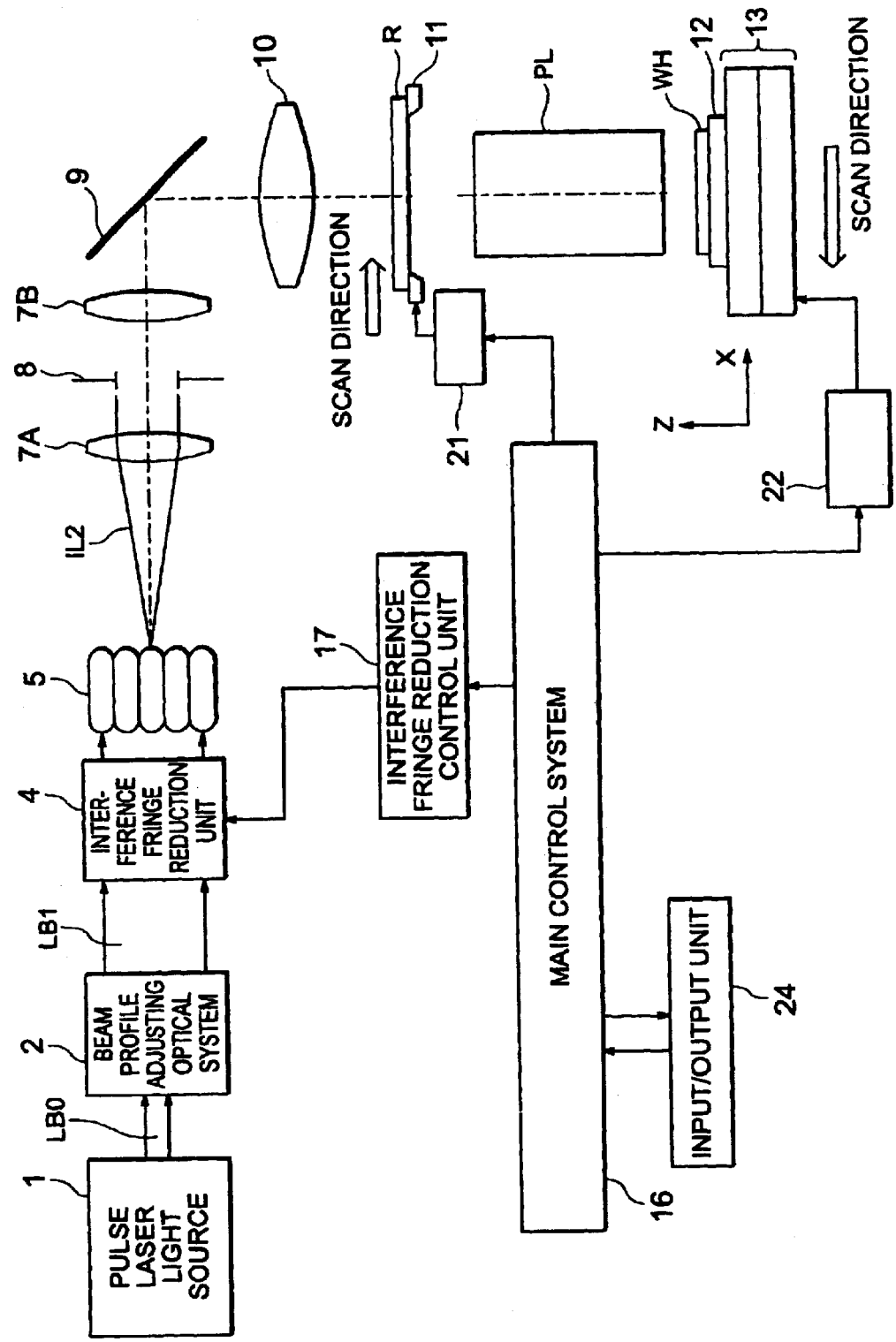
FIG. 1 is a view showing a configuration of a projection exposure apparatus using a wavefront aberration measuring apparatus in a first embodiment of the present invention.
Figure 2:
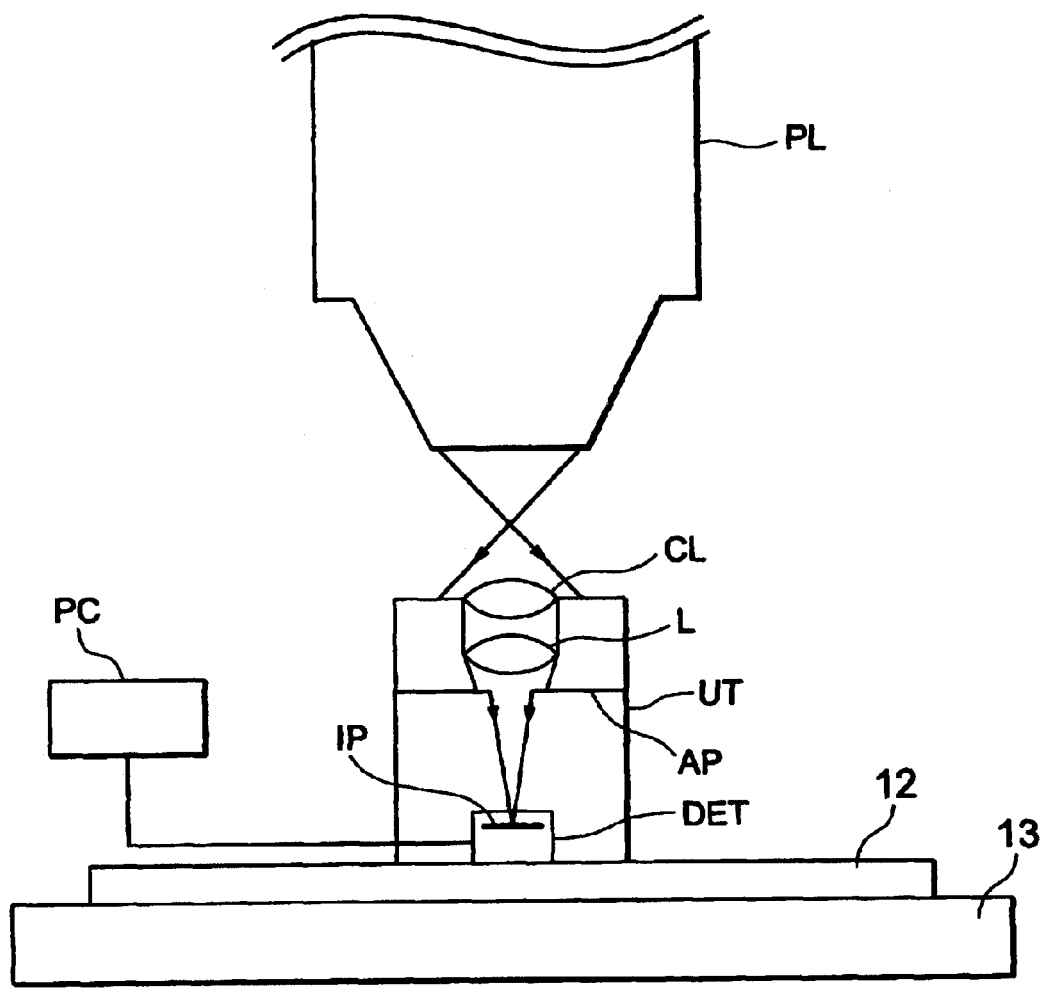
FIG. 2 is an enlarged view showing a configuration in the vicinity of a stage of the projection exposure apparatus shown in FIG. 1.

FIG. 1 is a view showing a configuration of a projection exposure apparatus to and from which a wavefront aberration measuring unit UT can be attached and detached that will hereinafter be explained. The projection exposure apparatus manufactures a semiconductor device formed with a circuit pattern. This-projection exposure apparatus will be outlined. Laser beam LB0 emitted from a laser light source 1 are adjusted in profile by a beam profile adjusting optical system 2 into substantially-collimated laser beam LB1. The laser beam LB1 travels through an interference fringe reduction unit 4 for averaging interference fringes and enter a fly-eye lens 5. The interference fringe reduction unit is structured to enhance uniformity of illuminance on a reticle, of which the principle is disclosed in Japanese Patent Laid-Open Publication No. 59-226317 by the present applicant. Laser beam IL2 exiting the fly-eye lens 5 is incident upon a field stop 8 via a first relay lens 7A. A profile of the laser beam IL2 is adjusted by the field stop 8. The field stop 8 is disposed in a conjugate to a pattern forming surface of the reticle R and to an exposure surface of a wafer WH. Laser beam IL2 exiting an aperture of the field stop 8 illuminates the reticle R (mask) formed with the circuit pattern through a second relay lens 7B, a mirror 9 and a condenser lens 10. The reticle R is placed on a stage 11, and, based on a command given from a main control system 16, a reticle stage control unit 21 moves the reticle stage 11. Then, a pattern image of the reticle R illuminated with the laser beam, is formed on the wafer WH defined as a substrate through a projection optical system PL. A variety of patterns are sequentially formed on the wafer WH by using a variety of reticles R in exchange, thereby forming a semiconductor device. The wafer WH is chucked in vacuum by a wafer holder 12 on a wafer stage 13. Further, wafer stage control unit 22 controls the stage 13 so that the stage 13 is positioned and moved stepwise at a high accuracy. An Input/Output unit 24 is a man-to-machine interface between the projection exposure apparatus body and an operator. FIG. 2 is an enlarged view showing the configuration in the vicinity of the stage of the present projection exposure apparatus. The wavefront aberration measuring unit UT is placed on the stage 13 through the wafer holder 12. When placing the unit UT on the wafer holder 12, the stage 13 is moved in an –Z direction in order to expand a spacing between the projection lens PL and the wafer holder 12. Next, the stage 13 is moved in X- and Y-directions by the stage control unit 22 so that the unit UT (particularly a collimator lens CL of the unit UT) faces to the projection lens PL. Note that the projection lens PL is used as a measurement target optical system of which a wavefront aberration is measured. Thus, in a state where the unit UT is set in the face-to-face relation with the projection lens PL, the wavefront aberration of the projection lens PL is measured.

Figure 3:
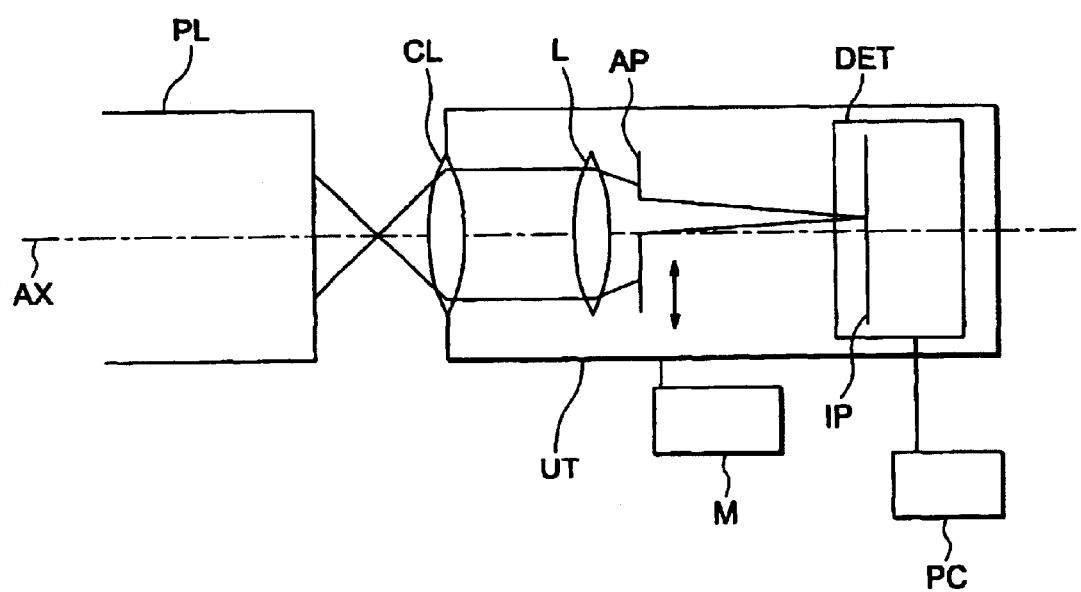
FIG. 3 is a view showing a configuration of the wavefront aberration measuring apparatus in the embodiment of the present invention.

FIG. 3 is a view showing a configuration of the wavefront aberration measuring unit UT in the first embodiment of the present invention. A specific configuration for measuring the wavefront aberration of the projection lens PL by the use of the wavefront aberration measuring unit UT according to the present invention, will be explained. It is to be noted that the wavefront aberration measuring unit UT is, as described above, placed on the wafer holder 12 on the stage 13. When measuring the wavefront of the projection lens PL, the light beam of which a wavefront is spherical are incident as light beam for measuring the wavefront aberration upon the projection lens PL. The light beam of the spherical wave can be generated from a pinhole pattern by disposing a mask including the pinhole pattern in a position (on an object plane of a projection optical system) where the reticle is disposed and illuminating this mask with the laser beam IL2. An aberration measuring optical system is constructed of this mask. Further, a point light source may be used as a substitute for the pinhole pattern. Moreover, the exposure light source is used in the first embodiment for emitting the laser beam with which the mask is illuminated, however, other light source and other illumination optical system may also be separately provided. The light beam of the spherical wave is incident on projection lens PL and exit the same lens PL. The light beam exited from the projection lens PL are collimated by the collimator lens CL. Then, the collimated light beam is converged by a converging lens L, and an aperture AP defined as an aperture stop disposed behind the lens L transmits only a part of the converged light beam. The part of light beam traveling through the aperture AP are converged as a converging point P on an imaging surface IP of a converging position detection unit DET such as a two-dimensional CCD. The converging point P may also be detected, without being limited to the two-dimensional CCD, by a scan using a one-dimensional CCD or by rotating the one-dimensional CCD, or further by executing two-dimensional scans using a sole optical sensor. Herein, if an aberration exists in the projection lens PL, a position of the converging point P is different from a case In which no aberration occurs in the projection lens PL. Namely, the position of the converging point when the aberration exists in the projection lens PL deviates sideways on the CCD surface from an ideal converging point with no aberration in the projection lens PL. Then, a moving unit M moves the aperture AP to scan over the entire surface of the measurement target wavefront while keeping mutual positional relations between the collimator lens CL, the converging lens L and the converging position detection unit DET. In such a case, it is preferable that the collimator lens CL, the converging lens L and the converging position detection unit DET be accommodated in an integral unit UT. Further, the converging position of the light beam transmitting the projection lens PL, i.e. the Imaging surface IP is conjugate to the surface of the wafer WH. Moreover, the wavefront aberration measuring unit implies a configuration containing the mask formed with the pinhole pattern or the point light source, the lens L and the converging position detection unit DET.

Thus, the moving unit M moves the aperture AP to scan over the entire surface of the measurement target wavefront while keeping the mutual positional relations between the collimator lens CL, the converging lens L and the converging position detection unit DET, whereby it is feasible to detect the lateral shift, on the CCD surface, of the converging point when the aberration exists in the projection lens from the ideal converging point with no aberration in the projection lens PL on the entire measurement target wavefront.

Note that a central area of the converging lens L is used when converging (the laser beams in the vicinity of an optical axis AX) on the central part of the measurement target wavefront, while a peripheral area of the converging lens L is used when converging (marginal light beam) on a peripheral portion of the measurement target wavefront in the first embodiment. Thus, different areas of the converging lens L are different, and hence, if this lens L has the aberration, the aberration might have an influence on the measured result. Such being the case, for reducing the influence by the aberration of the converging lens L, it is preferable that the converging lens L be moved with respect to the collimator lens CL and the detection unit DET while keeping the mutual positional relation between the lens L and the aperture AP. It is, however, more preferable that, as shown in FIG. 4A, a small-aperture lens L for converging a part of light beam of the measurement target wavefront, be used as the converging lens L, in the case of using this small-aperture lens L, the moving unit M moves the lens L so as to scan over the entire measurement target wavefront.

Figure 4A:
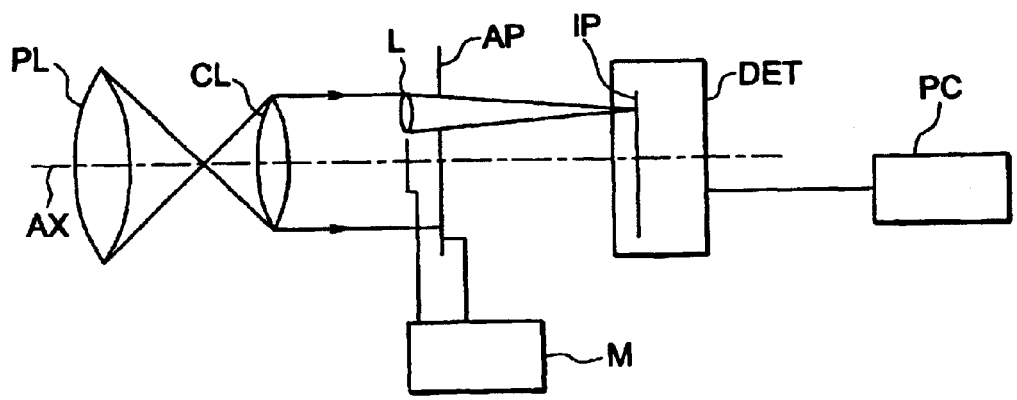
FIGS. 4A and 4B are views showing configurations of modified examples of the wavefront aberration measuring apparatus in the embodiment of the present invention.
Figure 4B:
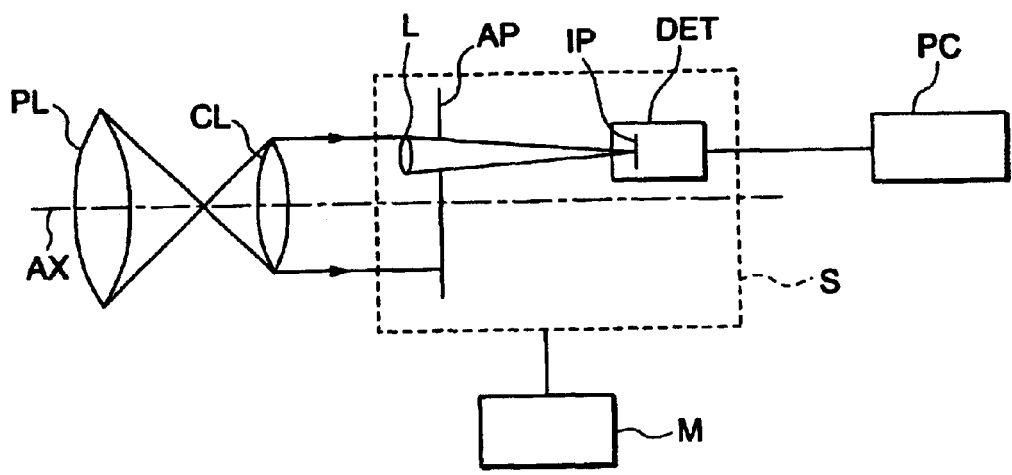

FIG. 4B shows a modified example of the configuration in FIG. 4A, wherein the entire measurement target wavefront is scanned while keeping the mutual positional relations between the lens L, the aperture AP and the detection unit DET which are housed in the unit UT. A measuring system S is constructed of the lens L, the aperture AP and the detection unit DET, and is moved within the unit UT by the moving unit M. According to this configuration, the detection unit in FIG. 4A can be downsized.

Figure 5A:
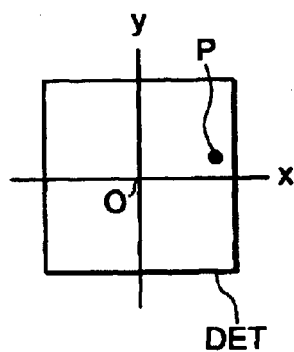
FIGS. 5A, 5B and 5C are diagrams each showing how a position of a converging point P shifts depending on a measuring position.
Figure 5B:
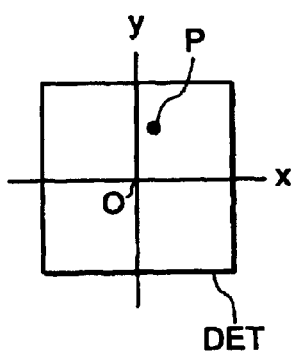
Figure 5C:
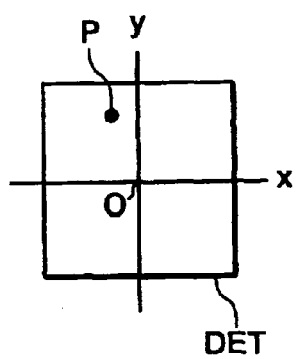

Next, a process of calculating the aberration of the measurement target optical system on the basis of an output signal transmitted from the converging position detection unit DET, will be explained. Described herein is a case where the wavefront aberration measuring unit takes the configuration shown in FIG. 4B. FIGS. 5A, 5B and 5C show measured results at three points within an arbitrary area of the measurement target wavefront, more specifically, how the converging point P on the detection unit DET changes when the measuring system S is moved to the three points. Herein, a plane of the imaging surface IP is set as an X-Y plane. If the measurement target wavefront is an ideal wavefront, i.e., a wavefront (spherical surface) with no aberration, the converging point P exists at a center 0 of the detection unit DET wherever the measuring system S moves within the measurement target wavefront. The actual measurement target wavefront, however, has the aberration, viz., a deviation (a difference in inclination of the wavefront) from the ideal wavefront. Accordingly, as shown in FIGS. 5A, 5B and 5C, depending on each converging point, the deviation at that converging point appears as a change (lateral shift) of the position of the converging point P in the detection unit DET. The positional deviation of the converging point P from the center corresponds to differential information of the measurement target wavefront, and therefore a value obtained from the positional deviation of the converging point P at each measuring point for every movement is integrated in sequence with respect to the entire measurement target wavefront, whereby an aberration of the measurement target wavefront can be calculated.

Figure 6:
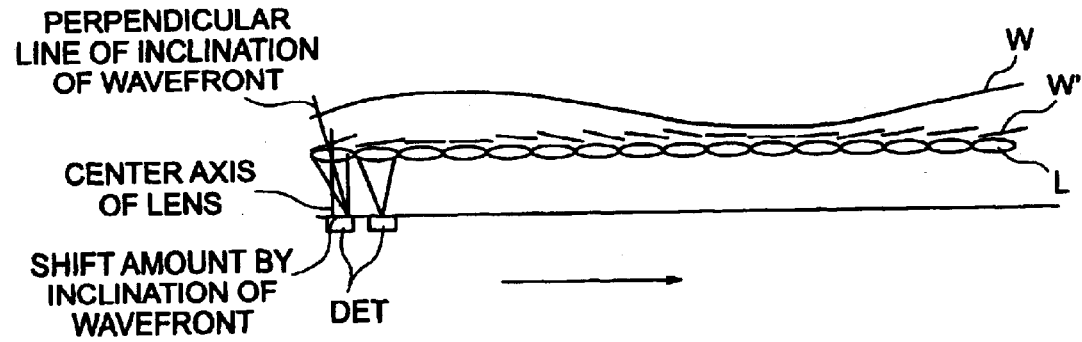
FIG. 6 is a conceptual view showing a relation between a measurement target wavefront W and an inclination W' of the wavefront.

FIG. 6 illustrates a concept of the calculating process described above. FIG. 6 shows how the measurement is conducted consecutively at the respective moving points. As discussed above, a shift quantity of the converging point P due to an inclination of a wavefront W' at each measuring point is sequentially integrated by the use of an arithmetic processor PC, thereby making it feasible to calculate the measurement target wavefront W. The aberration of the measurement target optical system can be obtained.

In the case of measuring the aberration of the measurement target optical system by using the configuration shown in FIG. 4A, a plurality of imaging areas are set on the imaging surface IP, and the lens L and the aperture AP are positioned with respect to each imaging area by the moving unit M. The position of the converging point at which the lens L converges the actual measurement target wavefront is changed from the center of the imaging area at which the lens L converges the ideal measurement target wavefront, and the change is detected. The aberration can be measured by detecting this positional change quantity. Note that the calculation of the measurement target wavefront W is the same as what has been described above.

Thus, at one point on the image forming surface through the projection lens PL, the positional deviation of each converging point of the measurement target wavefront from each converging point of the ideal wavefront, is measured. A spherical aberration and an astigmatic difference can be thereby obtained as the aberrations of the projection lens PL.

Further, the stage control unit 22 drives the stage 13 so that the unit UT moves to the plurality of points on the image forming surface through the projection lens PL. Then, at each of the plurality of points within the image forming surface of the projection lens PL, the moving unit M is controlled so that the entire measurement target wavefront is scanned through the lens L and the aperture AP within the unit UT or the measuring system S. With this operation, at each of the plurality of points within the image forming surface of the projection lens PL, it is feasible to measure the positional deviation of each converging point of the measurement target wavefront from each converging point of the ideal wavefront, and a comma, a curvature of field, a distortion and a astigmatism can be obtained as aberrations of the projection lens PL.

Note that the collimator lens CL for collimating the light beam of the measurement target wavefront is incorporated into the unit UT the first embodiment. The collimator lens CL may, however, be provided in a unit different from the unit UT. Moreover, as a matter of course, the light beam of spherical wave that travels through the measurement target optical system PL may be measured by the present apparatus without using the collimator lens CL.

As described above, the unit UT is placed on the wafer holder 12 on the stage 13, and the moving unit M moves the lens L and the aperture AP in the unit UT or the measuring system S, whereby the wavefront aberration of the projection lens PL can be simply measured. After measuring the wavefront aberration of the projection lens PL, the aberration measuring optical system (mask for measurement) is removed from the stage, and the unit UT is also removed from the stage 13. A weight of the stage 13 when used for exposure is reduced by removing the unit UT out of the stage 13. Further, the aberration can be measured by using the exposure light source on the projection exposure apparatus, and hence the apparatus can be downsized. Moreover, a space for the measurement using a separate interferometer is not required, and the aberration can be measured at a high accuracy because of using the single lens as a lens element. In addition, the projection lens PL can be adjusted based on the measured result in the state where the present wavefront aberration measuring unit is placed on the stage 13 of the projection exposure apparatus. In this case, if combined with an auto lens adjusting device, etc., the result of measuring the wavefront aberration is fed back to the auto lens adjusting device, and a spacing between the lenses can be adjusted. What is exemplified as the auto lens adjusting device may be a moving mechanism for changing the spacing between the lens elements by minutely moving in an optical-axis direction at least one of the lens elements constituting the projection lens PL, and a pressure adjusting mechanism for adjusting an air pressure between the lens elements, and so on. With these mechanism, the wavefront aberration of the projection optical system can be automatically corrected, and the image forming characteristic can also be enhanced.

Second Embodiment

Figure 7:
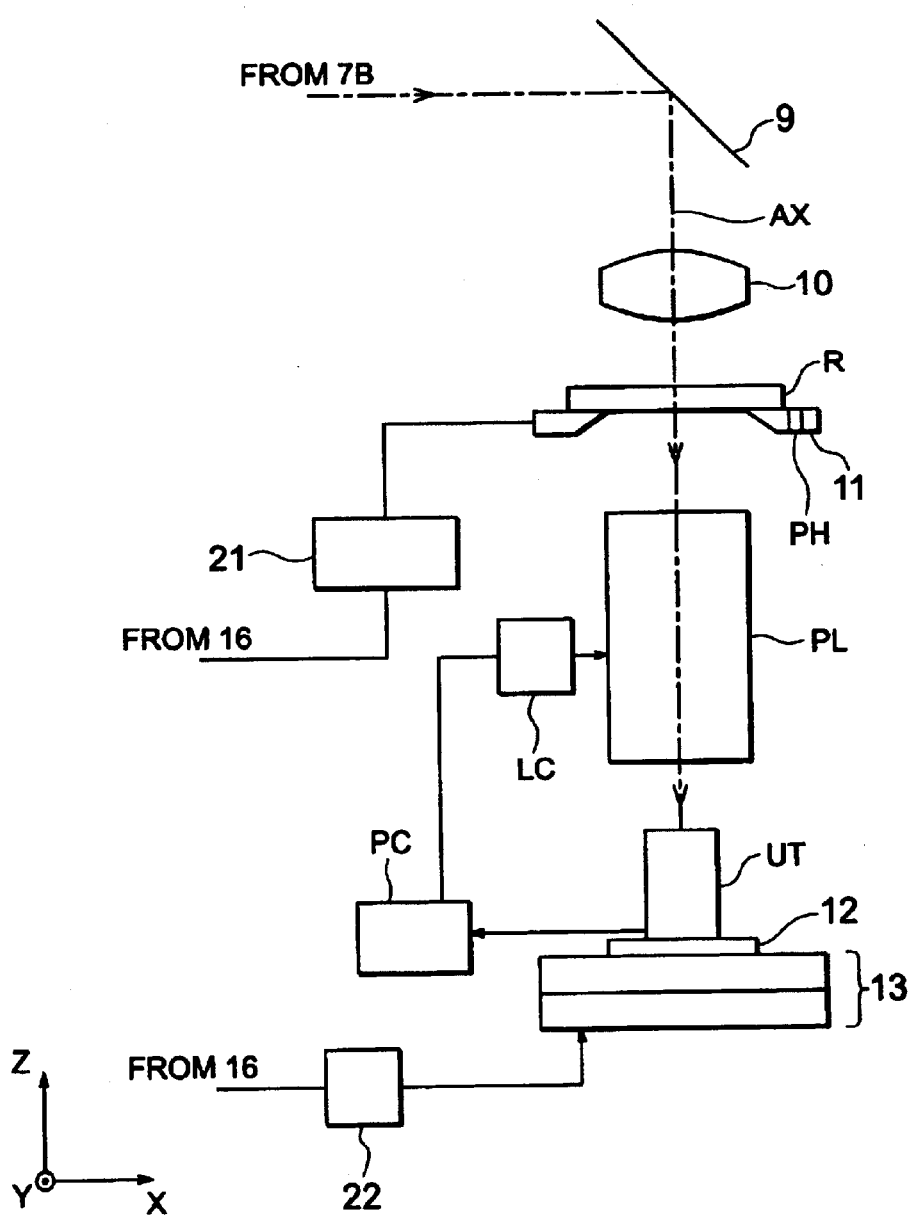
FIG. 7 is a view showing a configuration in the vicinity of the stage of the projection exposure apparatus in a second embodiment of the present invention.

FIG. 7 is an explanatory view showing an outline of configuration in the vicinity of the stage of the projection exposure apparatus in a second embodiment. The same components of the projection exposure apparatus in the second embodiment as those in the first embodiment, are marked with the like numerals, of which the repetitive explanations and illustrations are omitted.

In the first embodiment the wavefront aberration of the projection lens PL can be measured by the use of the exposure light source on the exposure apparatus. In this case, it is desirable that a reticle for measuring the aberration of the projection lens, which includes a point light source, i.e., a pinhole be provided in the position of the reticle R. Accordingly, the laser beam IL emitted from the exposure light source is converted into light beam of spherical wave by the pinhole of the reticle R. Herein, an enhancement of the accuracy of measuring the wavefront aberration of the projection lens PL may involve decreasing a diameter of the pinhole and making the spherical waves generated at the pinhole approximate to ideal spherical waves. When the diameter of the pinhole becomes small, however, a quantity of transmitted light beam decreases, a contrast on the imaging surface is lowered, with the result that a longer period of time is needed for the measurement. Further, because the projection lens aberration measuring reticle provided with the pinhole is used when measuring the wavefront aberration of the projection lens, and because a reticle for exposure is used when executing a normal pattern exposure, it is required that the reticle be re-placed on the reticle stage and be aligned each time the aberration is measured or the pattern exposure is carried out; and therefore, the throughput might decline.

The projection exposure apparatus in the second embodiment is contrived to obviate the above problem, and, as shown in FIG. 7, for instance, the reticle stage 11 has a pinhole PH for measuring the wavefront aberration of the projection lens.

The process of manufacturing the semiconductor device by the use of the reticle R formed with the circuit pattern is the same as the process described in the first embodiment, and its explanation is therefore omitted. Next, a process of measuring the wavefront aberration of the projection lens PL will be described. When measuring the wavefront aberration of the projection lens PL, the reticle stage control unit 21 drives the reticle stage 11 in a state of being mounted with the reticle R formed with the circuit pattern, and the pinhole PH is thereby moved onto the optical axis AX, wherein the aberration is measured with the light beam from the pinhole serving as a point light source. To start with, the wavefront aberration measuring unit UT (of which the construction is the same as in the first embodiment) is placed on the stage 12 via the wafer holder 12. Next, the moving unit M moves the lens L and the aperture AP or the measuring system S so that the entire measurement target wavefront from the converging lens is scanned through the lens L and the aperture AP within the unit UT or the measuring system S. As described above, the positional deviation of each converging point of the measurement target wavefront is obtained, and the arithmetic processor PC executes the integrating operation explained above. Herein, the converging position of the light beam transmitting the projection lens PL is conjugate to the surface of the wafer WH. Then, obtained data about the wavefront aberrations (the comma, the astigmatism, the spherical aberration, etc.) of the projection lens PL are fed back to a lens control unit LC. The lens control unit LC adjusts the spacing between the respective lens elements constituting the projection lens PL or an air pressure in that spacing therebetween on the basis of the wavefront aberration data, thereby restraining, within a predetermined range, a quantity of the aberration of the wavefront transmitting the projection lens PL. It is to be noted that the unit UT may take a configuration of being detachably provided directly on the wafer holder 12 or the stage 13, or assembled to the stage 13, and further a configuration of being detachably provided on the side surface of the stage 13.

Moreover, in the second embodiment, the light beam passing through the pinhole provided in the reticle stage is used as the light source, however, the present invention is not limited to this mode. The reticle stage may be provided with an area for diffusing and transmitting the light beam from the light source 1, the area being formed in a so-called lemon-skin state, and the light beam penetrating this lemon-skin area may be used as a light source for measuring the wavefront aberration. The lemon-skin area has a function of diffusing the transmission light beam as a glass-like diffusion plate has, and the light beam transmitting this area may be conceived as substantially-collimated light beams of a plurality of spherical waves emitted from a plurality of point light sources. Further, the pinhole or the lemon-skin area may be, without being limited to the example of its being provided in the reticle stage, provided in the reticle as in the first embodiment.

As discussed above, when the pinhole diameter is reduced, the quantity of the transmitted light beam decreases, and hence, though the measuring time becomes longer, the measurement accuracy can be enhanced. By contrast, when pinhole diameter is enlarged, the configuration of the spherical waves generated at the pinhole becomes less approximate to the ideal spherical waves, and therefore, though the measuring accuracy declines, the measuring time can be made shorter with a larger quantity of the transmitted light beam. Hence, it is desirable that the reticle stage 11 or the reticle R be formed with the pinholes having a plurality of sizes, and that the pinhole be alternatively selected and used corresponding to a target measuring accuracy. For example, if the setting of the projection exposure apparatus has already been completed and the exposures of the circuit patterns are sequentially executed, a main purpose is to measure changes with an elapse of time in terms of optical characteristics (image forming characteristics such as a magnification and a focal position, and fluctuations of transmittance) of the projection lens. It is therefore desirable that the wavefront measurement be performed at a proper accuracy for a short period of time when the light beam transmits the projection lens a predetermined number of times. Further, if the projection lens or at least one of the lens elements constituting the projection lens is replaced with other lens, it is desirable that a high-precision wavefront measurement be conducted taking a considerable period of time in the case of changing a wavelength of the light source. Thus, the pinholes having the plurality of sizes are formed, and the pinhole having the size optimal to the purpose can be thereby easily selected. Moreover, the exposure light source is used in the second embodiment as the laser beams with which the reticle stage is illuminated, however, other light source and other illumination optical system may separately be provided.

Third Embodiment

Figure 8:
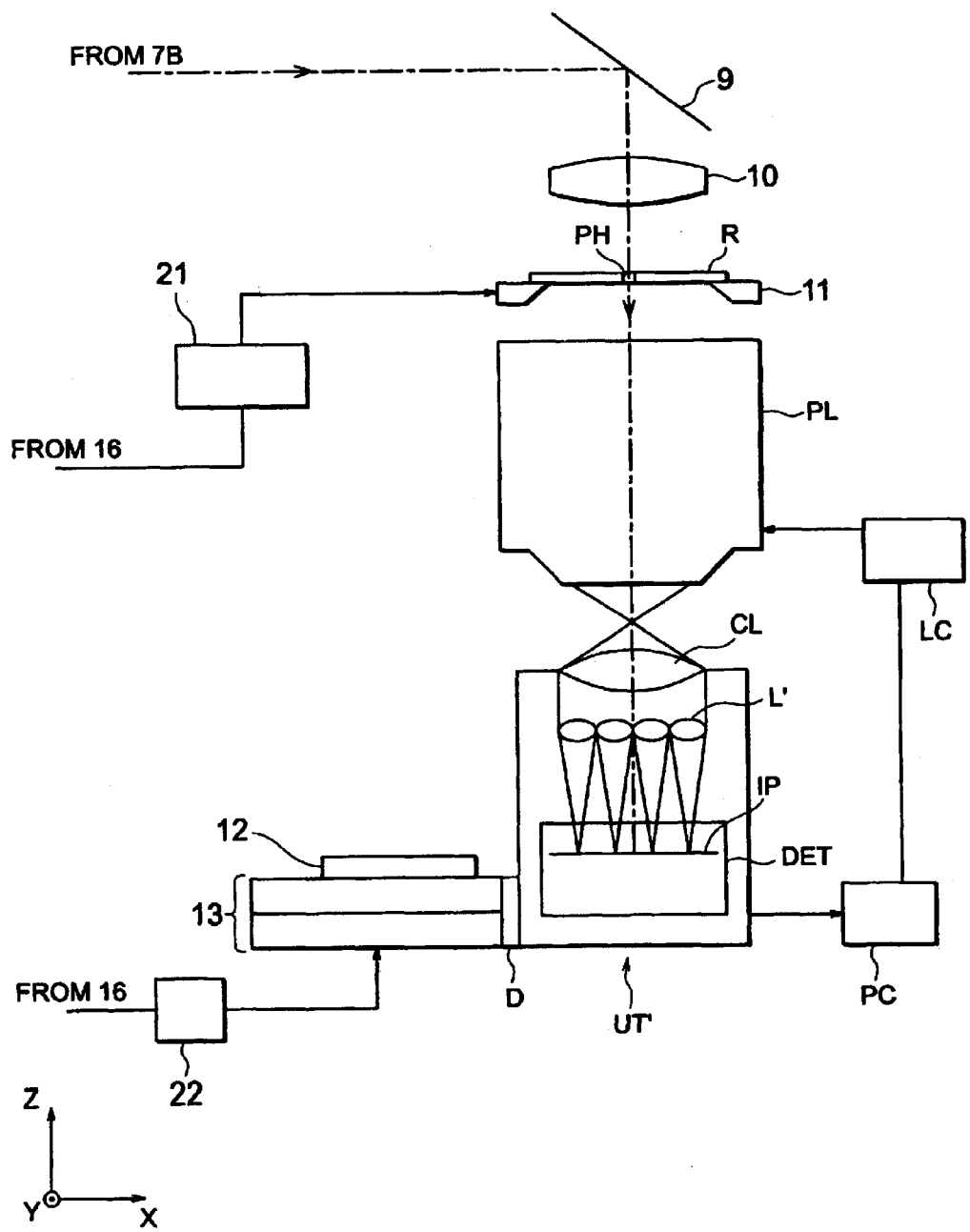
FIG. 8 is a view showing a configuration in the vicinity of the stage of the projection exposure apparatus in a third embodiment of the present invention.
Figure 9:
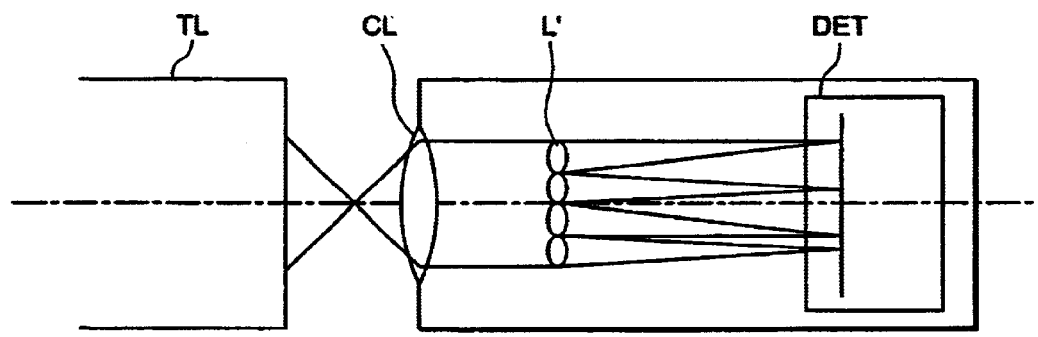
FIG. 9 is a view illustrating an architecture of a prior art wavefront aberration measuring apparatus.

FIG. 8 is a view showing an outline of configuration in the vicinity of the stage of the projection exposure apparatus in a third embodiment. The same components of the projection exposure apparatus in the third embodiment as those in the first embodiment, are marked with the like numerals, of which the repetitive explanations and illustrations are omitted.

The process of manufacturing the semiconductor device by the use of the reticle R formed with the circuit pattern, is the same as the process described in the first embodiment, and therefore its explanation is omitted. Next, the process of measuring the wavefront aberration of the projection lens PL will be explained.

The wafer stage control unit 22 controls driving of the wafer stage 13 so that the transmitted wavefront from through the projection lens PL is incident on an aberration measuring unit UT' detachably provided through an attaching/detaching mechanism D on a side surface of the stage 13. The aberration measuring unit UT' comprises a two-dimensional lens array including a plurality of lens elements L', two-dimensionally arrayed, for converging the light beams of the spherical waves generated at the pinholes PH and transmitting the projection optical system PL, and the converging position detection unit DET for detecting each of positions where the plurality of lens elements L' converge the light beams. Further, as in the first embodiment, the wavefront aberration measuring unit implies a configuration containing the mask formed with the pinhole PH and the pattern, the two-dimensional lens array L' and the converging position detection unit DET.

Note that the stage 11 of the reticle R, it is preferable, as stated in the embodiments discussed above, without being confined to the pinhole, be provided with any one of the pinhole the lemon-skin area. More preferably, it is desirable that the plurality of pinholes having different sizes be provided, and, as in the second embodiment, the pinhole suited to the measuring purpose be selected. Thus, the stage or the reticle including any one of the pinhole and the lemon-skin area constitutes the aberration measuring optical system.

The light beam transmitting the projection optical system PL are collimated by the collimator lens CL. Then, the parallel light beam is incident on the two-dimensional lens array where the minute lens elements L' are arrayed two-dimensionally. If the measurement target wavefront of the incident light beam has a deviation from the ideal wavefront, i.e. the wavefront with no aberration caused in the projection lens, this deviation appears to be a positional deviation of the converging position of the measurement target wavefront from the converging position of the ideal wavefront on the converging position detection unit DET. The arithmetic processor PC calculates a wavefront aberration of the projection lens PL on the basis of the positional deviation of the converging point of each individual lens element L' of the two-dimensional lens array.

Thus, at one point on the image forming surface through the projection lens PL, the positional deviation of each measuring point of the measurement target wavefront from each converging point of the ideal wavefront, is measured, thereby making it possible to obtain the spherical aberration and the astigmatic difference as the aberrations of the projection lens PL. Further, the stage control unit 22 drives the stage 13 so that the unit UT moves to a plurality of points on the image forming surface through the projection lens PL. Then, at each of the plurality of points on within the image forming surface through the projection lens PL, there is measured the positional deviation of each measuring point of the measurement target wavefront from each converging point of the ideal wavefront, and the comma, the curvature of field, the distortion and the astigmatism can be obtained as the aberrations of the projection lens PL from these results of the respective measurements.

Then, the wavefront aberration data about the thus obtained comma, curvature of field, distortion and astigmatism of the projection lens PL, are fed back to the lens control unit LC. The lens control unit LC, based on these pieces of wavefront aberration data, adjusts the spacing between the lens elements constituting the projection lens PL or the air pressure in that spacing, thereby restraining within the predetermined range a quantity of aberration of the wavefront passing through the projection lens PL. Note that the unit UT' may take a configuration of being detachably provided on the wafer holder 12 or the stage 13, or assembled to the stage 13, and further a configuration of provided in the vicinity of the stage 13.

The accuracy of measuring the aberration of the projection lens PL can be enhanced by increasing a measuring resolution of the converging position detection unit DET and a position control accuracy of the moving unit M or the wafer stage 13. For instance, if the detecting resolution of the converging position detection unit is on the order of 10–20 $\mu$m, it may be sufficient that the wafer stage 13 is controlled at a pitch of 1 mm in the projection exposure apparatus for an exposure of a 5 mm×5 mm area.

Further, an areal size of the aperture AP may be made variable in the first embodiment. In this case, the resolution becomes higher as the aperture is more stopped down, and hence the measuring accuracy is enhanced.

The embodiments discussed above may be combined as the necessity arises. In each of the embodiments, the wavefront aberration measuring unit is detachably provided on the stage 13, and may also be, as an attaching/detaching mechanism thereof, made detachable by providing the stage 13 with a notched portion and this measuring unit with an engagement member engaging with this notched portion. Moreover, in the case where the measuring unit is so constructed as to be attachable to and detachable from the stage 13, as a substitute for the whole measuring unit, some elements thereof, e.g., the collimator lens CL and the lens L may be detachably structured, while the detection unit DET may be fixed to the stage 13. Reversely, for instance, the collimator lens CL and the lens L may be fixed to the stage 13, while the detection unit DET may be detachably constructed.

In each of the embodiments, the wavefront aberration of the projection lens PL is measured in the state of having been assembled to the exposure apparatus, and may also be measured before being assembled to the exposure apparatus. A timing for measuring the wavefront aberration may be any one of timings when the wafer is replaced and the reticle is replaced, and an interval of a predetermined time, or timings other than these timings may also be adopted. On that occasion, the measuring accuracy, as described above, can be selected. Further, in the respective embodiments, the exposure light source is used as the light source for measuring the aberration, however, other light source may also be used, the exposure light source may involve the use of a g-line (436 nm), an i-line (365 nm), a KrF excimer laser (248 nm), an ArF excimer laser (193 nm), an $F_2$ laser (157 nm), and higher-harmonics of a metal vapor laser and a YAG laser.

Note that the exposure apparatus in this embodiment can be applied to the scan type exposure apparatus (U.S. Pat. No. 5,473, 410) for exposing to the light beam of a mask pattern by synchronously moving the mask and the substrate, or the step-and-repeat type exposure apparatus for exposing to the mask pattern in a state where the mask and the substrate are set stationary, and moving the substrate stepwise. The exposure apparatus is not limited to the application for manufacturing the semiconductor and can be applied widely to the use as a liquid crystal exposure apparatus for exposing, e.g., angular glass plate to the light beam of a liquid crystal display device pattern, and the use as an exposure apparatus for manufacturing a thin-film magnetic head.

As for a magnification of the projection lens as the measurement target optical system, not only a reduction system but also an equal-magnification and an enlargement system may be adopted. The projection lens may involve the use of a material such as quartz and fluorite as a glass material that transmits far ultraviolet rays if using the far ultraviolet rays such as excimer lasers. In the case of using the F2 laser and X-rays, there may be a catadioptric system or refracting optical system (a reflecting type of reticle is likewise used).

When using the far ultraviolet rays are used as the excimer laser, an optical path between the light source and the substrate is purged by an inactive gas. Thus, in the case of using the far ultraviolet rays, the interior of the wavefront aberration measuring unit UT may also be purged by the inactive gas. What Is used as an inactive gas may be helium, neon, argon, krypton, xenon, radon, etc. if the wavelength of the exposure light beam is a wavelength (e.g., the I-line, KrF, etc.) that is not absorbed by oxygen, there may be used chemically clean dry air (which is the air from which substances becoming a cause of hazing of the lens, e.g. ammonium ions, etc floating within a clean room are removed, or the air of which a humidity is 5% or under).

As discussed above, the exposure apparatus and the aberration measuring unit in this embodiment are manufactured by assembling a variety of subsystems including the respective elements given in claims of the invention of the present application so as to keep the predetermined mechanical, electrical and optical accuracies. Ensuring these accuracies entails, before and after the assembly, making adjustments for attaining the optical accuracy with respect to the variety of optical systems, adjustments for attaining the mechanical accuracy with respect to the variety of mechanical systems, and adjustments for attaining the electrical accuracy with respect to the variety of electrical systems. A process of the assembly into the exposure apparatus from the variety of subsystems includes mechanical connections between the variety of subsystems, wire connections of an electric circuit and pipe connections of an atmospheric pressure circuit.

Before the process of the assembly into the exposure apparatus from the variety of subsystems, as a matter of course, there are assembling processes of the individual subsystems. Upon an end of the process of the assembly into the exposure apparatus from the variety of subsystems, a total adjustment is executed, thus ensuring the various accuracies as the whole exposure apparatus. Note that the exposure apparatus, it is desirable, be manufactured in the clean room where a temperature and a degree of cleanness are managed. Further, the semiconductor device is manufactured by a step of designing a function and a performance of the device, a step of manufacturing the reticle based on this design step, a step of manufacturing the wafer by the use of a silicon material, a step of exposing the wafer to the light beam of the reticle pattern by the exposure apparatus in the embodiments discussed above, a device assembling step (containing a dicing step, a bonding step and a package step), and an inspection step.

INDUSTRIAL APPLICABILITY

As explained above, according to the invention of aspect 1, there is provided the converging position detection unit for detecting the positional deviation of the converging position of a part of the light beam passing through the aperture stop on the predetermined surface, and the aperture stop is moved in such a direction as to intersect the optical axis. Accordingly, he aberration of the measurement target optical system can be measured with a high precision in a small-sized and simple configuration by using neither the interferometer nor the two-dimensional lens array.

According to the invention of aspect 2, the converging lens converges a part of the light beam, and the moving unit moves the converging lens and the aperture stop as an integral element in such a direction as to intersect the optical axis. Hence, the converging lens may be of a small size and is therefore easy to manufacture, and the cost thereof is low. Further, the light beam is always converged by the use of the entire surface of the small-sized converging lens, and a measurement error due to an influence of the aberration of the converging lens itself can be reduced.

According to the invention of aspect 3, the wavefront aberration of the lens used in the projection exposure apparatus for manufacturing the semiconductor device, etc., can be easily measured.

According to the invention of aspect 4, it is possible to precisely quickly measure the aberration by the use of the spherical waves penetrating the pinhole pattern.

According to the invention of aspect 5, there may be used the light beam from the illumination optical system for illuminating the reticle having the predetermined circuit pattern with the light beam.

According to the invention of aspect 6, the aberration of the measurement target optical system can be measured with a high accuracy in the small-sized and simple configuration by using neither the interferometer nor the two-dimensional lens array.

According to the invention of aspect 7, the converging lens may be of a small size and is therefore easy to manufacture, and the cost thereof is low. Further, the light beam is always converged by the use of the entire surface of the small-sized converging lens, and a measurement error due to an influence of the aberration of the converging lens itself can be reduced.

According to the invention of aspect 8, the wavefront aberration of the projection optical system used in the projection exposure apparatus for manufacturing the semiconductor device, etc., can be easily measured.

According to the invention of aspect 9, the aberration can be precisely quickly measured by the use of the spherical waves penetrating the pinhole pattern.

According to the invention of aspect 10, the aberration of the projection optical system for forming a predetermined circuit pattern on the substrate can be measured with a high accuracy in the small-sized and simple configuration by using neither the interferometer nor the two-dimensional lens array.

According to the invention of aspect 11, the aberration of the projection optical system can be precisely quickly measured by the use of a generation member for generating the light for measuring the aberration.

According to the invention of aspect 12, the aberration of the projection optical system can be precisely quickly measured by the use of the spherical waves penetrating the pinholes.

According to the invention of aspect 13, the aberration of the projection optical system can be precisely quickly measured by substantially-collimated light beam of a multiplicity of spherical wave transmitting in diffusion a transmission member.

According to the invention of aspect 14, the wavefront aberration of the projection optical system used in the projection exposure apparatus for manufacturing the semiconductor device, etc., can be easily measured.

According to the invention of aspect 15, the aberration can be precisely quickly measured by the use of the spherical waves penetrating the pinhole pattern.

According to the invention of aspect 16, the control unit, based on a result of measuring the aberration, adjusts a spacing between lens elements of the projection optical system, and thus corrects the wavefront aberration of the projection optical system, whereby image forming characteristics can be enhanced.

According to the invention of aspect 17, the aberration of the projection optical system can be easily measured simply by installing the wavefront aberration measuring unit on, e.g., a wafer stage of the projection exposure apparatus. Further, the light source of the exposure apparatus can be used as it is, and hence the apparatus can be downsized.

According to the invention of aspect 18, the aberration of the projection optical system can be measured with a high accuracy in the small-sized and simple configuration by using neither the interferometer nor the two-dimensional lens array. It is therefore feasible to enhance the image forming performance and manufacture a device with a high resolution.

According to the invention of aspect 19, the wavefront aberration of the projection optical system used in the projection exposure apparatus for manufacturing the semiconductor device, etc., can be easily measured. It is therefore feasible to enhance the image forming performance and manufacture the device with the high resolution.

According to the invention of aspect 20, the aberration of the projection optical system can be precisely quickly measured by the use of the generation member for generating the light beam for measuring the aberration, and hence the exposure with an enhanced throughput can be executed.

According to the invention of aspect 21, it is possible to easily measure the aberration of the projection optical system and correct the aberration of the projection optical system on the basis of the measured result, whereby an exposure method capable of exhibiting a high image forming performance can be provided.

According to the invention of aspect 22, it is possible to easily measure the wavefront aberration of the projection optical system and correct the wavefront aberration of the projection optical system on the basis of the measured result, whereby the exposure method capable of exhibiting the high image forming performance can be provided.

According to the invention of aspect 23, the aberration measuring unit can be detachably held in the exposure apparatus for manufacturing the semiconductor device, etc. and it is therefore easy to install or replace this aberration measuring unit when measuring the aberration.

According to the invention of aspect 24, the aberration measuring optical system and the measuring unit can be easily detachably Installed in the exposure apparatus.

According to the invention of aspect 25, a mask can be easily detachably placed on a mask stage, and the measuring unit can be easily detachably attached to a substrate stage.

According to the invention of aspect 26, the mask having the pinhole pattern can be easily detachably provided, and hence a pinhole having a diameter proper to the aberration measurement can be easily selected.

According to the invention of aspect 27, the aberration of the projection optical system can be easily measured simply by installing the wavefront aberration measuring unit on, e.g., the wafer stage of the projection exposure apparatus. Further, the light source of the exposure apparatus can be used as it is, and hence the aberration measuring unit can be downsized.

According to the invention of aspect 28, the aberration of the projection optical system can be precisely quickly measured by the use of the light beam from the aberration measuring optical system provided on the mask stage. Further, the measuring unit can be easily detachably provided on the substrate stage.

According to the invention of aspect 29, the aberration of the projection optical system can be readily measured simply by installing the measuring unit on the wafer stage of the projection exposure apparatus by the use of the light beam from the aberration measuring optical system. Moreover, the light source of the exposure apparatus can be used as it is, and hence the apparatus can be downsized.

According to the invention of aspect 30, a weight of the substrate stage can be reduced by removing the measuring unit.

According to the invention of aspect 31, the aberration of the projection optical system is measured before transferring the circuit pattern, and therefore the pattern can be precisely transferred.

According to the invention of aspect 32, the aberration of the projection optical system is measured before transferring the circuit pattern, and hence the device can be manufactured exactly with the high precision.

What is claimed is:

1. An aberration measuring apparatus comprising:
    a converging lens disposed on the light path of light beam to converge light beam traveling through a measurement target optical system on a predetermined surface;
    an aperture stop disposed on the light path of light beam to transmit a part of the light beam:
    a moving unit connected the aperture stop to move said aperture stop within the light beam;
    a converging position detection unit disposed on the predetermined surface to detect a positional deviation of a converging position of a part of the light beams traveling through said aperture stop on the predetermined surface; and
    an arithmetic processing unit connected the converging position detection unit to calculate an aberration of said measurement target optical system on the basis of an output signal from said converging position detection unit.

2. An aberration measuring apparatus according to claim 1, wherein said converging lens converges a part of the light beams, and
    said moving unit moves said converging lens integrally with said aperture stop in the direction intersecting the optical axis of the light beam.

3. An aberration measuring apparatus that measures an aberration of a projection optical system that transfers onto a substrate, an image of a predetermined circuit pattern formed on a mask, comprising:
    an aberration measuring optical system disposed on the object plane side of the projection optical system to emit a light beam which measures the aberration upon said projection optical system;
    a plurality of lens elements, two-dimensionally arrayed, disposed on the image plane side of the projection optical system to converge the light beams through said projection optical system;

a converging position detection unit disposed on the image plane of the lens elements to detect each of positions of the light beams converged by said plurality of lens elements; and a measuring device connected the converging position detection unit to measure the aberration of said projection optical system on the basis of the converged light positions detected by said converging position detection unit.

4. An aberration measuring apparatus according to claim 3, wherein said aberration measuring optical system includes:

a mask which measures the aberration, disposed substantially in the same position as said mask formed with the predetermined circuit pattern is disposed and having a pinhole pattern; and an illumination optical system that illuminates said mask which measures the aberration with the light beam.

5. An aberration measuring apparatus according to claim 4, wherein said illumination optical system is an illumination optical system that illuminates the predetermined circuit pattern with the light beam.

6. An aberration measuring method comprising:

converging light beam traveling through a measurement target optical system on a predetermined surface by the use of a converging lens;

making an aperture stop transmit a part of the light beam;

moving said aperture stop within the light beam;

detecting a positional deviation of each of a converging position of a part of the light beam traveling through said aperture stop on the predetermined surface by the use of a converging position detection unit; and calculating an aberration of said measurement target optical system on the basis of an output signal obtained in said converging position detecting step.

7. An aberration measuring method according to claim 6, wherein a part of the light beam is converged in said converging step, and said converging lens is moved integrally with said aperture stop in the direction intersecting the optical axis of the light beam in said moving step.

8. An aberration measuring method of measuring an aberration of a projection optical system that forms, on a substrate, an image of a predetermined circuit pattern formed on a mask through the projection optical system, comprising:

converging the light beams which measures the aberration that have passed through said projection optical system by the use of a plurality of lens elements;

detecting each of positions of the light beams converged by said plurality of lens elements; and measuring the aberration of said projection optical system on the basis of the detected light positions.

9. An aberration measuring method according to claim 8, wherein the light beam which measures the aberration is light beam from a pinhole pattern on a mask, which measures the aberration, disposed substantially in the same position as the said mask is disposed.

10. An aberration measuring method according to claim 8, further comprising a step for correcting the measured aberration of said projection optical system.

11. An aberration measuring apparatus that measures an aberration of a projection optical system which transfers onto a substrate an image of a pattern formed on a mask, comprising:

a measuring unit detachably provided on an exposure apparatus including a mask stage which holds said mask, said projection optical system, and a substrate stage which holds said substrate, wherein said measuring unit includes:

a plurality of lens elements, two-dimensionally arrayed, disposed on the image plane side of the projection optical system to converge the light beams through said projection optical system;

a converging position detection unit disposed on the image plane of the lens elements to detect each of positions of the light beams converged by said plurality of lens elements: and a measuring device connected the converging position detection unit to measure the aberration of said projection optical system on the basis of the light positions detected by said converging position detection unit.

12. An aberration measuring apparatus according to claim 11, further comprising an aberration measuring optical system through which the light beam which measures the aberration fall on said projection optical system, wherein said measuring unit is detachably held on said substrate stage, and said aberration measuring optical system is provided on said mask stage.

13. An aberration measuring method which measures an aberration of a projection optical system incorporated into an exposure apparatus which transfers onto a substrate an image of a pattern formed on a mask, comprising:

disposing an aberration measuring optical system, to emits a light beam which measures the aberration upon said projection optical system, substantially in the same position as said mask is disposed; and attaching, to a substrate stage which holds said substrate, a measuring unit including:

a plurality of lens elements disposed on the image plane side of the projection optical system to converge the light beams through said projection optical system; a converging position detection unit disposed on the image plane of the lens elements to detect each of positions of the light beams converged by said lens array; and a measuring device connected the converging position detection unit to measure the aberration of said projection optical system on the basis of the light beam positions detected by said converging position detection unit.

14. An aberration measuring method according to claim 13, further comprising:

removing said aberration measuring optical system after the light beam which measures the aberration have fallen upon said projection optical system; and removing said measuring unit from said substrate stage after measuring the aberration of said projection optical system.

15. An aberration measuring apparatus which measures an aberration of a projection optical system which transfers onto a substrate an image of a pattern formed on a mask, comprising:

a measuring unit detachably provided on an exposure apparatus including a mask stage which holds-said mask, said projection optical system, and a substrate stage which holds said substrate, wherein said measuring unit includes:

a plurality of lens elements, two-dimensionally disposed, disposed on the image plane side of the projection optical system to converge the light beams through said projection optical system;

a converging position detection unit disposed on the image plane of the lens elements to detect each of positions of the light beams converged by said plurality of lens elements; and an output unit which outputs a result of the detection by said converging position detection unit to a correcting mechanism for correcting the aberration of said projection optical system.

* * * * *

UNITED STATES PATENT AND TRADEMARK OFFICE
CERTIFICATE OF CORRECTION

PATENT NO. : 6,819,414 B1
DATED : November 16, 2004
INVENTOR(S) : Hitoshi Takeuchi It is certified that error appears in the above-identified patent and that said Letters Patent is hereby corrected as shown below:

Title page,
Add the following:
-- [63] Related U.S. Application Data
Continuation of Application No. PCT/JP99/02608 filed on May 19, 1999

[30] Foreign Application Priority Data
May 19, 1998     (JP) ……………..10-153915 --

Signed and Sealed this

Third Day of May, 2005

JON W. DUDAS
*Director of the United States Patent and Trademark Office*